(12) United States Patent
Zanetta et al.

(10) Patent No.: US 9,680,453 B1
(45) Date of Patent: Jun. 13, 2017

(54) OSCILLATOR CIRCUIT

(71) Applicant: FREESCALE SEMICONDUCTOR, INC., Austin, TX (US)

(72) Inventors: Pedro Barbosa Zanetta, Campinas (BR); Andre Luis Vilas Boas, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/231,916

(22) Filed: Aug. 9, 2016

(51) Int. Cl.
| | |
|---|---|
| H03L 7/00 | (2006.01) |
| H03K 4/501 | (2006.01) |
| H03L 7/089 | (2006.01) |
| H03L 7/099 | (2006.01) |
| H03K 5/13 | (2014.01) |
| H03K 5/131 | (2014.01) |
| H03K 3/0231 | (2006.01) |
| H03B 5/24 | (2006.01) |
| H03K 5/00 | (2006.01) |

(52) U.S. Cl.
CPC ............. *H03K 4/501* (2013.01); *H03B 5/24* (2013.01); *H03K 3/0231* (2013.01); *H03K 5/13* (2013.01); *H03K 5/131* (2013.01); *H03L 7/00* (2013.01); *H03L 7/089* (2013.01); *H03L 7/099* (2013.01); *H03K 2005/00065* (2013.01)

(58) Field of Classification Search
CPC ...... H03K 3/2823; H03K 3/0231; H03K 5/13; H03K 5/131; H03K 2005/00065; H03K 2005/00156; H03L 7/00
USPC ...... 331/111, 113 R, 143; 327/276, 281, 261
See application file for complete search history.

(56) References Cited

U.S. PATENT DOCUMENTS

| | | | |
|---|---|---|---|
| 4,982,169 | A | 1/1991 | Wyman |
| 6,734,918 | B2 | 5/2004 | Inoue |
| 7,113,116 | B2 | 9/2006 | Brewer et al. |
| 7,157,956 | B2 | 1/2007 | Wei |
| 7,427,880 | B2 | 9/2008 | Takahashi et al. |
| 7,673,151 | B2 | 3/2010 | Rottschafer et al. |
| 7,733,191 | B2 | 6/2010 | Olmos et al. |
| 8,065,531 | B2 | 11/2011 | Tobergte |
| 8,265,265 | B2 | 9/2012 | Van Rijnswou |
| 8,289,069 | B2 | 10/2012 | Cheng |
| 8,487,795 | B1 | 7/2013 | Jiang et al. |

(Continued)

OTHER PUBLICATIONS

Chen, Lidong. "SP 800-108. Recommendation for Key Derivation Using Pseudorandom Functions (Revised)." (2009).

(Continued)

*Primary Examiner* — Arnold Kinkead

(57) ABSTRACT

Aspects of various embodiments of the present disclosure are directed to applications utilizing oscillator circuits. In certain embodiments, an apparatus includes an oscillator circuit having one or more capacitors. The oscillator circuit is configured to generate an oscillating signal by repeated charging and discharging of the capacitors. The apparatus also includes a control circuit connected to the oscillator. The control circuit is configured to set the oscillation frequency of the oscillator circuit as a non-linear function of an input control signal. For instance, in a more specific embodiment, the control circuit may be configured to set oscillation frequency of the oscillator circuit to a frequency scaled by a value raised to an exponent specified by the input control signal.

19 Claims, 6 Drawing Sheets

(56) References Cited

U.S. PATENT DOCUMENTS

2011/0051927 A1 3/2011 Murray et al.
2013/0063166 A1* 3/2013 Ng .................... G01R 31/343
                                                           324/682

OTHER PUBLICATIONS

Pique, G.V.; Meijer, M., "A 350nA voltage regulator for 90nm CMOS digital circuits with Reverse-Body-Bias," in ESSCIRC, 2011.
Li, Ting, Yuxin Wang, and Ruzhang Li. "A feedback based charge pump." Anti-Counterfeiting, Security and Identification (ASID), 2011 IEEE International Conference on. IEEE, 2011.
Notice of Allowance for U.S. Appl. No. 15/231,946 mailed Jan. 20, 2017.

* cited by examiner

OSCILLATOR CIRCUIT

OVERVIEW

Aspects of various embodiments relate generally to electronic systems and methods for operating the electronic systems and, more particularly, to oscillator architectures and methods for generating oscillating signals.

Oscillators are used in a various applications and various different types of devices. For example, many integrated circuit devices include oscillators to generate reference clocks used in the system. For instance, an oscillator may be used to generate a clock signal used to control sampling of a digital signal or synchronize actions between multiple devices. Different applications may generate clock signals using various types of oscillating circuits including, for example, ring oscillators and phase-locked-loops (PLLs). Ring oscillators use an odd number of inverters connected in series in a loop. Oscillation frequency of ring oscillators is dictated by the switching speed of the inverters used to form the ring oscillators. Oscillating signals generated using ring oscillators may exhibit a high degree of variation in oscillation frequency over voltage-temperature corners during operation. PLLs can be used to generate more accurate oscillating signals over voltage-temperature corners, but generally require a larger circuit area.

These and other matters have presented challenges to efficiencies of oscillator circuit implementations, for a variety of applications.

SUMMARY

Various example embodiments are directed to circuits and methods for generating oscillating signals. According to an example embodiment, an apparatus includes an oscillator circuit having one or more capacitors. The oscillator circuit is configured to generate an oscillating signal by repeated charging and discharging of the capacitors. The apparatus also includes a control circuit connected to the oscillator. The control circuit is configured to set an oscillation frequency of the oscillator circuit as a non-linear function of an input control signal. In a specific embodiment, the control circuit may be configured to set the oscillation frequency of the oscillator circuit to a frequency scaled by a value raised to an exponent specified by the input control signal. The control circuit is configured to adjust the oscillation frequency, for example, by adjusting capacitance of capacitors of the oscillator circuit and/or adjusting resistance of a current path used to charge the capacitors.

In another specific example embodiment, the oscillator circuit includes a switching circuit is configured to alternate between operation in first and second modes. In the first mode, a first capacitor of the oscillator circuit is charged via a resistive path and a second capacitor of the oscillator circuit is discharged. In the second mode the second capacitor of the oscillator circuit is charged via the resistive path and the first capacitor of the oscillator circuit is discharged. The oscillator circuit includes a comparison circuit configured to set an oscillating signal to a first value (e.g., by setting a SR latch) and operate the oscillator in the second mode in response to the first capacitor becoming charged. In response to the second capacitor becoming charged, the comparison circuit is configured to set the oscillating signal to a second value (e.g., by resetting the SR latch) and operate the oscillator in the first mode.

In certain embodiments, the oscillator also includes a switching circuit. The switching circuit is configured to operate in a first mode in response to the oscillating signal having a first value and operate in a second mode in response to the oscillating signal having a second value. In the first mode, the switching circuit charges the first capacitor via a resistive path and discharges the second capacitor. In the second mode, the switching circuit charges the second capacitor via the resistive path and discharges the first capacitor. The comparison circuit is configured to set the oscillating signal to the first value based on a comparison of a voltage of the first capacitor to a first threshold voltage and set the oscillating signal to the second value based on a comparison of a voltage of the second capacitor to a second threshold voltage.

In certain embodiments, the comparison circuit includes an inverter circuit configured to set the oscillating signal to the first value in response to voltage at a terminal of the first capacitor falling below a threshold voltage. The comparison circuit also includes a buffer circuit configured to set the oscillating signal to the second value in response to voltage at a terminal of the second capacitor exceeding the threshold voltage.

In certain embodiments, the oscillator circuit further includes a latch circuit and the comparison circuit is configured to set the oscillating signal to the first value by providing a set control signal to the latch circuit and set the oscillating signal to the second value by providing a reset control signal to the latch circuit.

In certain embodiments, the switching circuit is configured and arranged to charge the first capacitor by providing a current in a first direction through the resistive path from a first power supply node to the first capacitor and charge the second capacitor by providing a current in a second direction through the resistive path from the second capacitor to a second power supply node.

In certain embodiments, the control circuit is configured and arranged to adjust the oscillation frequency by adjusting a resistance of a resistive path of the oscillator circuit used for charging the one or more capacitors and adjusting a capacitance of the one or more capacitors.

In certain embodiments, the input control signal specifies a numerical value. The control circuit may include a first circuit configured to determine a target frequency as a function having the numerical value as an exponent. The control circuit may also include a second circuit configured to determine a capacitance value and resistance value for the target frequency. The second circuit may also be configured to set the oscillation frequency of the oscillator circuit to the target frequency by setting the resistance of the current path to the determined resistance value and setting the capacitance of the one or more capacitors to the determined capacitance value.

In certain embodiments, the second circuit includes a look up table storing respective pairs of resistance and capacitance values for each of a plurality of target frequencies. In certain embodiments, the second circuit is configured and arranged to determine the target frequency by multiplying a first constant value by a second constant value raise to the power of the numerical value specified by the input control signal.

According to another example embodiment, a method is provided for generating an oscillating signal. An oscillating signal is generated by repeated charging and discharging of the one or more capacitors of an oscillator circuit. Oscillation frequency of the oscillator circuit is adjusted as a non-linear function of an input control signal. In a specific example embodiment, the oscillation frequency is adjusted by setting the oscillation frequency to a frequency scaled by a value having an exponent value specified by the input control signal.

In certain embodiments, the oscillator circuit includes a first capacitor and a second capacitor. In generation of the oscillating signal includes: in response to an oscillating signal having a first value, charging the first capacitor via a resistive path and discharge the second capacitor; in response to an oscillating signal having a second value, charging the second capacitor via the resistive path and discharge the first capacitor; setting the oscillating signal to the first value based on a comparison of a voltage of the first capacitor to a first threshold voltage; and setting the oscillating signal to the second value based on a comparison of a voltage of the second capacitor to a second threshold voltage.

In certain embodiments, the oscillator circuit also includes a latch circuit configured to output the oscillating signal. The oscillating signal is set to the first value by providing a set signal to the latch circuit. The oscillating signal is set to the second value by providing a reset signal to the latch circuit.

In certain implementations, the set signal is provided to the latch circuit by an inverter circuit. The inverter circuit is configured to output the first value in response to an input of the inverter having a voltage less than the threshold voltage and output the second value in response to the input of the inverter having a voltage greater than the threshold voltage. The set signal is provided to the latch circuit by a buffer circuit. The buffer circuit is configured to output the first value in response to an input of the buffer having a voltage greater than the threshold voltage and output the second value in response to the input of the buffer having a voltage less than the threshold voltage.

In certain embodiments, the first capacitor is charged by providing a current in a first direction through the resistive path from a first power supply node to the first capacitor and the second capacitor is charged by providing a current in a second direction through the resistive path from the second capacitor to a second power supply node.

In certain embodiments, the adjusting of the oscillation frequency includes adjusting a resistance of a current path of the oscillator circuit connecting a current source to the one or more capacitors and adjusting a capacitance of the one or more capacitors.

In certain embodiments, the input control signal specifies a numerical value and the adjusting of the oscillation frequency includes: determining a target frequency as a function having the numerical value as an exponent; determining a capacitance value and a resistance value for the target frequency; and setting the oscillation frequency of the oscillator circuit to the target frequency by setting a resistance of a current path of the oscillator circuit to the determined resistance value and setting the capacitance of the one or more capacitors to the determined capacitance value. In certain implementations, the determining of the capacitance value and the resistance value includes retrieving the capacitance value and resistance value from a look up table storing a respective pair of resistance and capacitance values for each of a plurality of target frequencies. In certain implementations, the target frequency is determined by multiplying a first constant value by a second constant value raise to the power of the numerical value specified by the input control signal.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
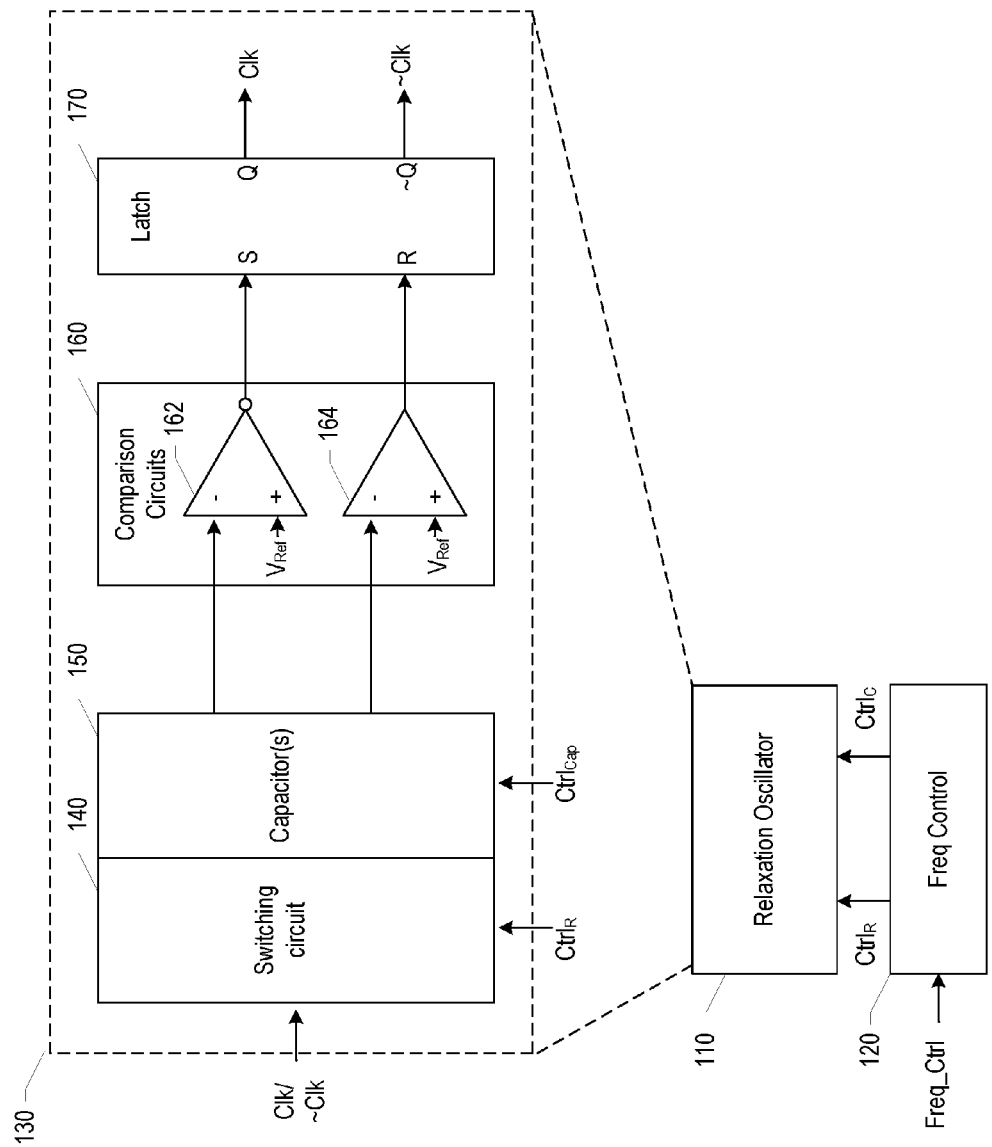
FIG. 1 shows a block diagram of an example circuit for generation of an oscillating signal, in accordance with one or more embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving generation and/or use of oscillating signals. In certain implementations, aspects of the present disclosure have been shown to be beneficial when used in the context of applications that adjust frequency of an oscillator during operation. While not necessarily so limited, various aspects may be appreciated through a discussion of examples using such exemplary contexts.

In the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

According to an example embodiment, an apparatus includes an oscillator circuit having one or more capacitors. The oscillator circuit is configured to generate an oscillating signal by repeated charging and discharging of one or more capacitors. The frequency of the oscillating signal is determined by the time required to charge and/or discharge the capacitors. The apparatus also includes a control circuit connected to the oscillator. The control circuit may adjust the oscillation frequency of the oscillator by adjusting capacitance of capacitors of the oscillator and/or adjusting resistance of a current path used to charge the capacitors. The control circuit is configured to set the oscillation frequency of the oscillator circuit as a non-linear function of an input control signal. For instance, in some implementations, the control circuit is configured to set oscillation frequency of the oscillator circuit to a frequency scaled by a value raised to an exponent specified by the input control signal.

A non-linear response of the control circuit (e.g., an exponential response) may allow the input control signal to operate the oscillator in a wide frequency range with less circuitry in comparison to linear control methods. A wider frequency range may be advantageous for various applications that adjust frequency of an oscillator during operation. As an illustrative example, frequency of a switching signal used to control switching of a switching regulator or charge pump may be adjusted to improve power efficiency for different load and/or power supply conditions. For instance, load may vary during operation by more than three orders of magnitude over process and temperature corners in some applications. By setting oscillation frequency of the oscillator circuit as an exponential function of a value indicated by an input control signal, the oscillator circuit can be adjusted to operate over a wide frequency range to accommodate for variation in load during operation.

In different embodiments, oscillator circuits may be implemented using various circuit arrangements. In an example embodiment, an oscillator circuit is configured to alternate between charging a first capacitor of the oscillator circuit in a first mode and charging a second capacitor of the oscillator circuit in a second mode. The oscillator circuit includes a switching circuit configured to facilitate charging and discharging of the capacitors. In the first mode, the switching circuit charges the first capacitor via a resistive path and discharges the second capacitor. In the second mode, the switching circuit charges the second capacitor via the same resistive path and discharges the first capacitor. The oscillator circuit also includes a comparison circuit configured to set an oscillating signal to a first value and cause the switching circuit to operate the oscillator in the second mode in response to the first capacitor becoming charged. In response to the second capacitor becoming charged, the comparison circuit is configured to set the oscillating signal to a second value and cause the switching circuit to operate the oscillator in the first mode.

Turning now to the figures, FIG. 1 shows a block diagram of an example circuit arrangement for generation of an oscillating signal, in accordance with the present disclosure. The circuit arrangement includes a relaxation oscillator 110 and a frequency control circuit 120. The frequency control circuit 120 is configured to adjust the oscillation frequency of the relaxation oscillator 110 by adjusting capacitance of capacitors of the oscillator and/or adjusting resistance of a current path used to charge the capacitors. In this example, the frequency control circuit 120 is configured to adjust the oscillation frequency by adjusting capacitance of the capacitors 150 via control signal $Ctrl_C$ and/or adjusting resistance of a current path, used to charge the capacitors 150, via control signal $Ctrl_R$. The frequency control circuit 120 may be configured to select a target frequency as a non-linear function of a value specified by an input control signal Freq_Ctrl. For example, frequency control circuit 120 may select the target frequency according to an exponential function of Freq_Ctrl. The control circuit is configured to set $Ctrl_C$ and $Ctrl_R$ to values to cause the oscillator circuit to oscillate at the target frequency.

The relaxation oscillator 110 may be implemented with various circuit arrangements. Block 130 shows a high-level block diagram of an example relaxation oscillator. In this example, the relaxation oscillator 130 includes one or more capacitors 150 a switching circuit 140 configured to alternate between charging and discharging of each of the capacitors 150, according to the value of a generated oscillating signal (Clk). A comparison circuit 160 is configured to set a value of the oscillating signal Clk based on a comparison of voltage(s) of the capacitor(s) 150 to one or more threshold voltages. In this example, the comparison circuit 160 adjusts the value of the oscillating signal Clk by setting/resetting an SR latch circuit 170. For instance, the comparison circuit 160 may include a first comparator 164 configured to reset the latch 170 in response to a first one of the capacitors 150 becoming charged above a reference/threshold voltage and a second comparator 162 configured to set the latch 170 in response to a second one of the capacitors 150 becoming charged above a reference/threshold voltage. After being set, in response to the second capacitor becoming charged, the latch 170 holds the value of the oscillating signal Clk at logic 1 until the latch is reset in response to the first capacitor becoming charged. After being reset, the latch 170 holds the value of Clk at logic 0 until the latch is set in response to the second capacitor becoming recharged.

Figure 2:
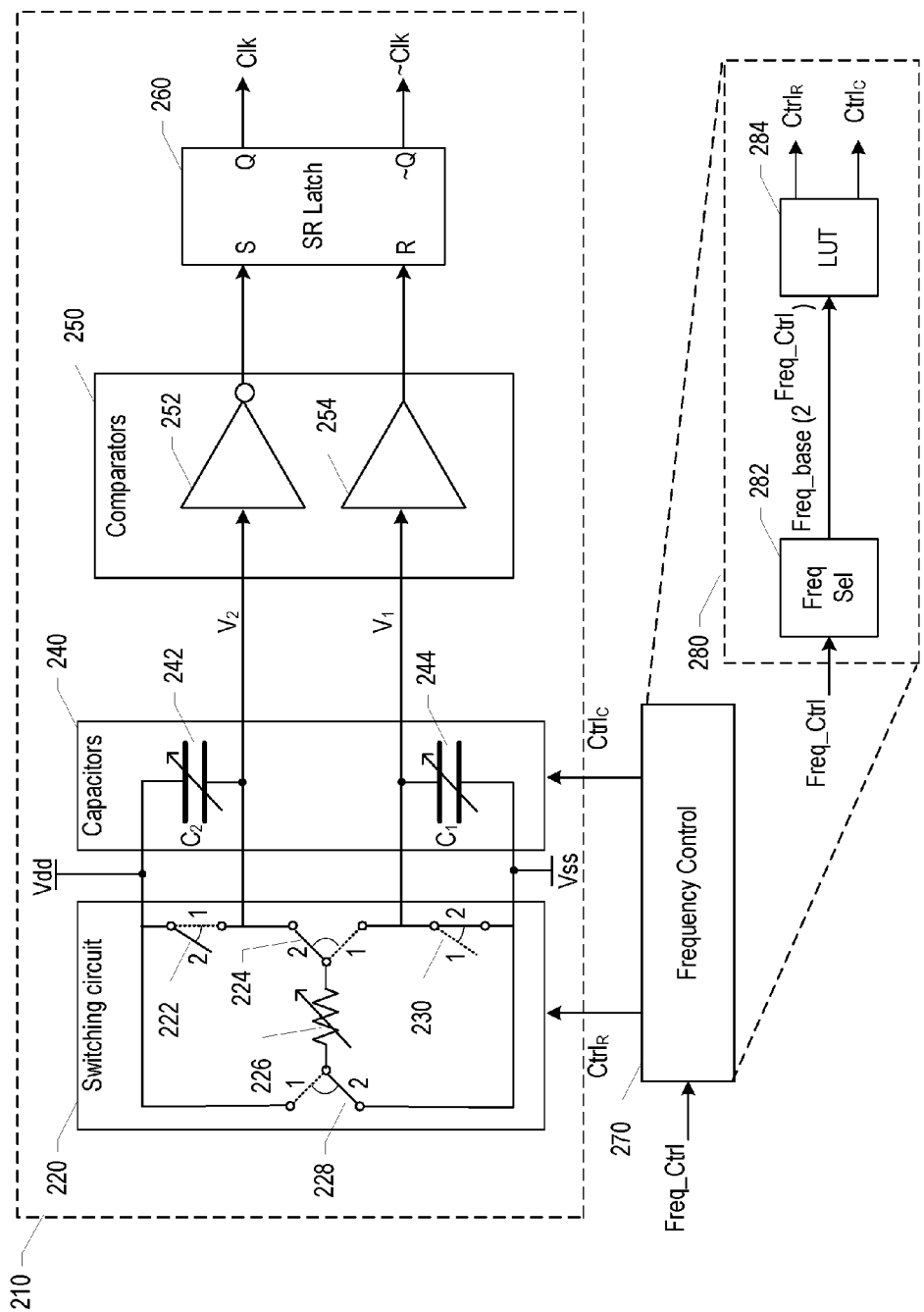
FIG. 2 shows a block diagram of another example circuit for generation of an oscillating signal, in accordance with one or more embodiments of the present disclosure.

FIG. 2 shows a block diagram of another example circuit arrangement for generation of an oscillating signal, in accordance with the present disclosure. The circuit arrangement includes a relaxation oscillator 210 and a frequency control circuit 270 configured to operate as described with reference to the relaxation oscillator 110 and the frequency control circuit 120 in FIG. 1.

In this example, relaxation oscillator 210 includes a switching circuit 220, a set of capacitors 240, a comparison circuit 250, and a latch 260 configured and arranged as described with reference to the switching circuit 140, capacitor(s) 150, comparison circuit 160 and a latch 170 of example oscillator 130 in FIG. 1. In this example, the set of capacitors 240 of relaxation oscillator 210 includes two variable capacitors 242 and 244. The switching circuit 220 is configured to alternate between charging a first capacitor 244 in a first mode and charging a second capacitor 242 in a second mode. In the first mode, switch 222 is closed to discharge capacitor 242. Capacitor 244 is charged by opening the switch 230 and configuring switches 224 and 228 to provide a current path from Vdd, through variable resistor 226, to capacitor 244. In the second mode, capacitor 244 is discharged by closing switch 230. Capacitor 242 is charged by opening the switch 222 and arranging switches 224 and 228 to provide a current path from capacitor 242, through variable resistor 226, to Vss.

The comparison circuit 250 is configured to set the value of the oscillating signal Clk, and switch between the first and second modes of operation, by setting/resetting SR latch circuit 260. In response to the capacitor 244 becoming charged, the comparison circuit 250 is configured to reset the latch 260 and thereby switch to the second mode of operation. In response to the capacitor 242 becoming charged, the comparison circuit 250 is configured to set the latch 260 and thereby switch to the first mode of operation.

In different embodiments, the comparison circuit 250 may be implanted with various circuit arrangements. For instance, in some embodiments, the comparison circuit 250 may include a number of comparators configured to detect when each capacitor is charged by comparing a voltage of the capacitor to a reference voltage. Alternatively, in this example, the comparison circuit 250 is configured to detect when the capacitors are charged using buffer and inverter circuits, which are configured to indicate whether a voltage is greater than or less than a threshold switching voltage. The comparison circuit 250 includes an inverter circuit 252 configured to set the latch 260 in response to voltage $V_2$ dropping below a threshold voltage Vth of the inverter (e.g., when charge of capacitor 242 reaches ((Vdd−Vss)−Vth). The comparison circuit 250 includes a buffer 254 configured to reset the latch 260 in response to voltage $V_1$ exceeding a threshold voltage Vth of the buffer. The use of inverter and buffer circuits 252 and 254 to detect when the capacitors have reached the threshold charge allows the comparison circuit 250 to be implemented with less circuitry in comparison to a comparator-based implementation. For instance, reference voltages and/or currents do not need to be generated for comparison. In this manner, may a simpler circuit implementation can be achieved.

The frequency control circuit 270 is configured to adjust the oscillation frequency of the relaxation oscillator 210 by adjusting capacitance of capacitors 242 and 244 and/or adjusting resistance of a variable resistor (e.g., 226) in a current path used to charge the capacitors 242 and 244. Adjusting the capacitance, changes the amount of energy required to charge each capacitor to a threshold level. Adjusting the resistance changes the current used to charge the capacitors—thereby adjusting time required to charge each capacitor. By adjusting the capacitance and/or resistance, the time required to charge each capacitor to the threshold level may be increased or decreased, thereby changing the oscillation frequency. In this example, variable resistor 226 is included in the current path used to charge capacitor 242 and also in the current path used to charge capacitor 244. Accordingly, adjustment of the single variable resistor 226 can be adjusted to change the charge times for both of the capacitors 242 and 244. This arrangement requires less circuitry in comparison to a switching circuit arrangement that uses separate current paths to charge the respective capacitors 242 and 244.

In this example, the frequency control circuit 270 is configured to adjust the oscillation frequency by adjusting capacitance of the set of capacitors 240 via control signal $Ctrl_C$ and/or adjusting resistance of variable resistor 226 via control signal $Ctrl_R$. The control circuit is configured to set the oscillation frequency of the oscillator circuit as a non-linear function of an input control signal Freq_Ctrl. In this example, the input control signal Freq_Ctrl indicates a logarithmic value of a target oscillation frequency. The control circuit is configured to set $Ctrl_C$ and $Ctrl_R$ to values to cause the oscillator circuit to oscillate at the target frequency.

The frequency control circuit 270 may adjust oscillation using various circuits and/or processes. Block 280 shows an example circuit arrangement implementing the frequency control circuit 270. The circuit arrangement 280 includes a frequency selection circuit 282 configured to determine a target oscillation frequency operation of the oscillator circuit 210. In this example, the target frequency determined according to an exponential function of Freq_Ctrl (e.g., Target Frequency=Freq_base (Const$^{Freq\_Ctrl}$).

The circuit arrangement 280, includes a second circuit configured to determine $Ctrl_C$ and $Ctrl_R$ values that cause the oscillator circuit 210 to oscillate at the target frequency. In this example, the $Ctrl_C$ and $Ctrl_R$ values are determined by retrieving the values from a look-up-table (LUT) 284. For example, the LUT 284 may indicate a respective pair of $Ctrl_C$ and $Ctrl_R$ values for each of a plurality of target frequencies.

The time period $T_{Low}$, in which the oscillation signal is set to a low value (e.g., logic 0), is determined by resistance of the variable resistor 226 and the capacitance of capacitor 242. The time period $T_{High}$, in which the oscillation signal is set to a high value, is determined by resistance of the variable resistor 226 and the capacitance of capacitor 244. In some embodiments, the frequency control circuit 270 is configured to set variable capacitors 242 and 244 to exhibit the same capacitance—thereby causing $T_{Low}$ and $T_{High}$ to be equal.

In some other embodiments, capacitance of the capacitors 242 and 244 may be adjusted so that $T_{High}$ and $T_{Low}$ differ. As an illustrative example, a switched mode power supply may charge a smoothing capacitor from a voltage source when the oscillation signal is high and disconnect the smoothing capacitor from the voltage source when the oscillation signal is low. An output voltage provided by the smoothing capacitor may be adjusted by changing the ratio of the $T_{High}$ time period to the $T_{Low}$ time period. As another illustrative example, an oscillating signal may be used to control duty cycling of one or more circuits. For instance, in low power applications duty cycling may be used to power down an idle communication circuit and periodically wake the circuit for short time periods to check a transmission medium for communication. Duty-cycling places a circuit in an inactive or powered down state for a significant fraction of the time in use (e.g., between transmitted pulses). In some embodiments, the $T_{High}$ and $T_{Low}$ time periods may be adjusted to set the time periods in which circuits are powered down or awake during duty cycled operation.

In some oscillators, error may be introduced in oscillating frequency exhibited by the oscillator due to variations in supply voltages (e.g., Vdd and Vss). Error may also be introduced due to process variation causing transistors of the oscillator to have slightly different threshold voltages. In some implementations, sensitivity to variation in supply and/or threshold voltages is reduced by charging each of the capacitors 242 and 244 from different supply voltages, such as Vdd and Vss shown in FIG. 2.

Figure 3:
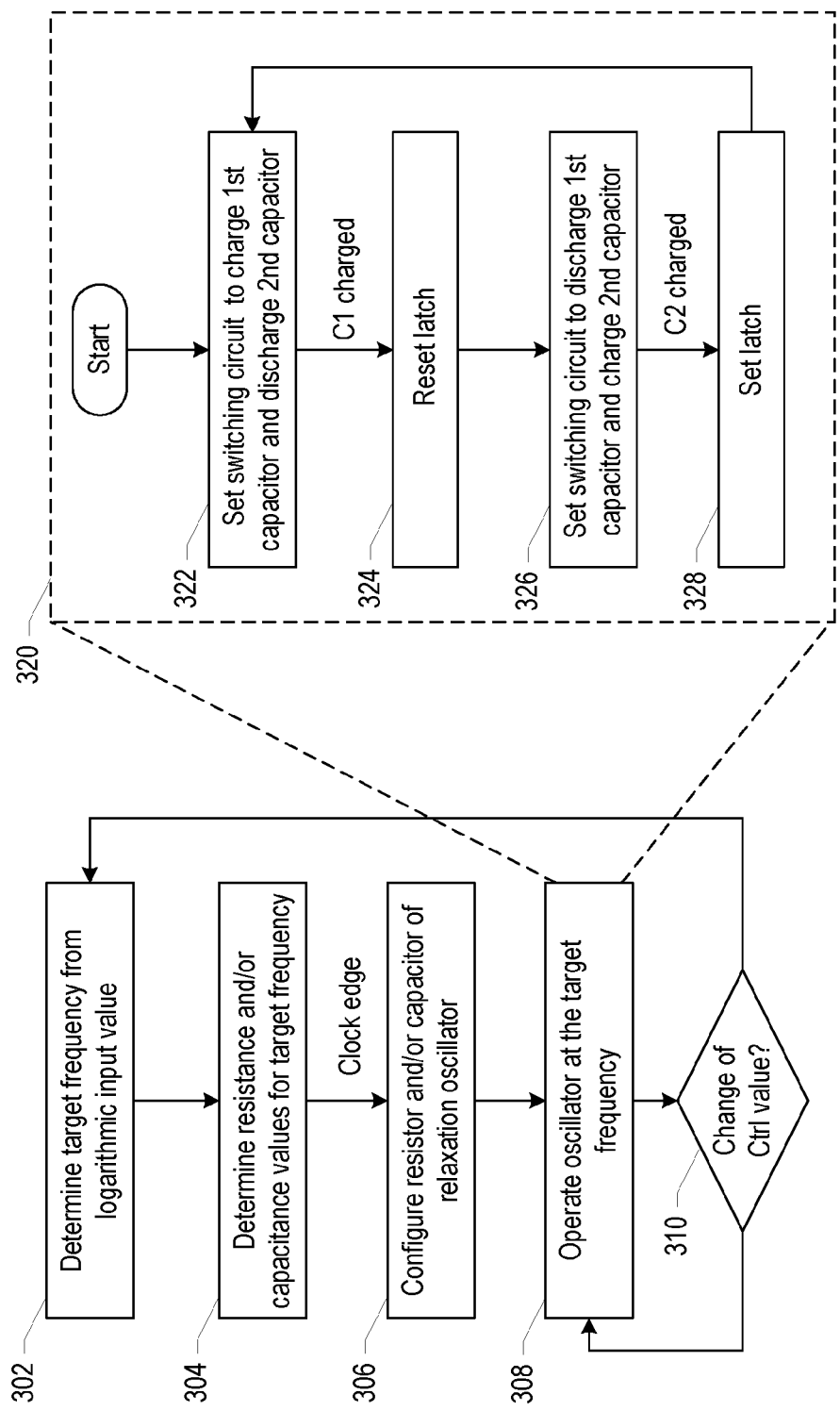
FIG. 3 shows a flow chart of an exemplary process for generation of an oscillating signal, in accordance with one or more embodiments of the present disclosure.

FIG. 3 shows a flow chart of an exemplary process for generation of an oscillating signal, in accordance with the present disclosure. At block 302, a target oscillation frequency is determined from a value indicated by an input control signal. The value may be determined, for example by scaling a based frequency with a value raised to the value indicated by an input control signal. At block 304, resistance and/or capacitance values are determined for the target frequency. At block 306, variable capacitors (e.g., 240) of the oscillator and/or a variable resistor (e.g., 226) of the oscillator are configured according to the resistance and/or capacitance determined at block 304. At block 308, the oscillator is operated at the target frequency. If the value of the input control signal changes, the process proceeds from decision block 310 back to block 302 and the process is repeated. In order to avoid high frequency glitches on the output signal which may cause failures on some systems, the new resistance and/or capacitance values may only be applied after the next clock edge.

Block 320 shows an example process for operating of an oscillator in accordance with one or more embodiments. At block 322, a switching circuit is set to charge a first capacitor and discharge a second capacitor. In response to the first capacitor becoming charged above a threshold charge, the process proceeds to block 324. At block 324, the latch of the oscillator is reset. At block 326, the switching circuit is set to discharge the first capacitor and charge the second capacitor. In response to the second capacitor becoming charged above a threshold charge, the process proceeds to block 328. At block 328, the latch of the oscillator is set and the process is repeated. The repeated setting and resetting of the latch causes the latch to generate an oscillating signal at an output.

Figure 4:
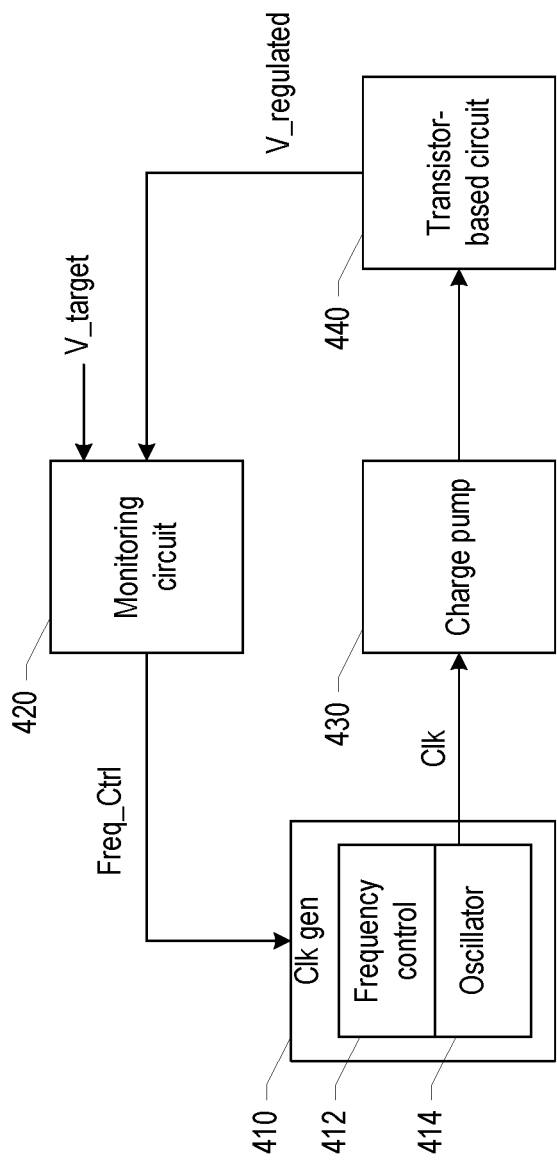
FIG. 4 shows a system level diagram of an apparatus including an oscillator circuit, in accordance with one or more embodiments of the present disclosure.

FIG. 4 shows a system level diagram of an apparatus including an oscillator circuit, in accordance with the present disclosure. The apparatus includes a clock generation circuit 410 configured to generate an oscillating signal Clk having a frequency determined according to an input control signal. The clock generation circuit 410 may be implemented, for example, using an oscillator circuit 414 and frequency control circuit 412 configured to operate as described with reference to the oscillator circuit 110 and frequency control circuit 120 in FIG. 1 or the oscillator circuit 210 and frequency control circuit 270 in FIG. 2.

The oscillating signal Clk is used to control switching of a charge pump 430 to generate a regulated voltage. The regulated voltage may be used, for example, to power and/or bias transistors of a transistor-based circuit 440. As previously mentioned, load may vary during operation, for example, due to changes in switching activity and/or operating temperature. In this example, the apparatus includes a monitoring circuit 420 configured to dynamically adjust the oscillating frequency of oscillator circuit 414 on the fly according to the load characteristics placed on the charge pump 430 by the transistor-based circuit 440. For instance, in each measurement period the monitoring circuit 420 may increment or decrement the value of the input control signal Freq_Ctrl by one step to adjust operating frequency in response to changes in the load. Exponential frequency tuning of the frequency control circuit 412 reduces time required to adjust the oscillating frequency to compensate for changes in the load.

Figure 5:
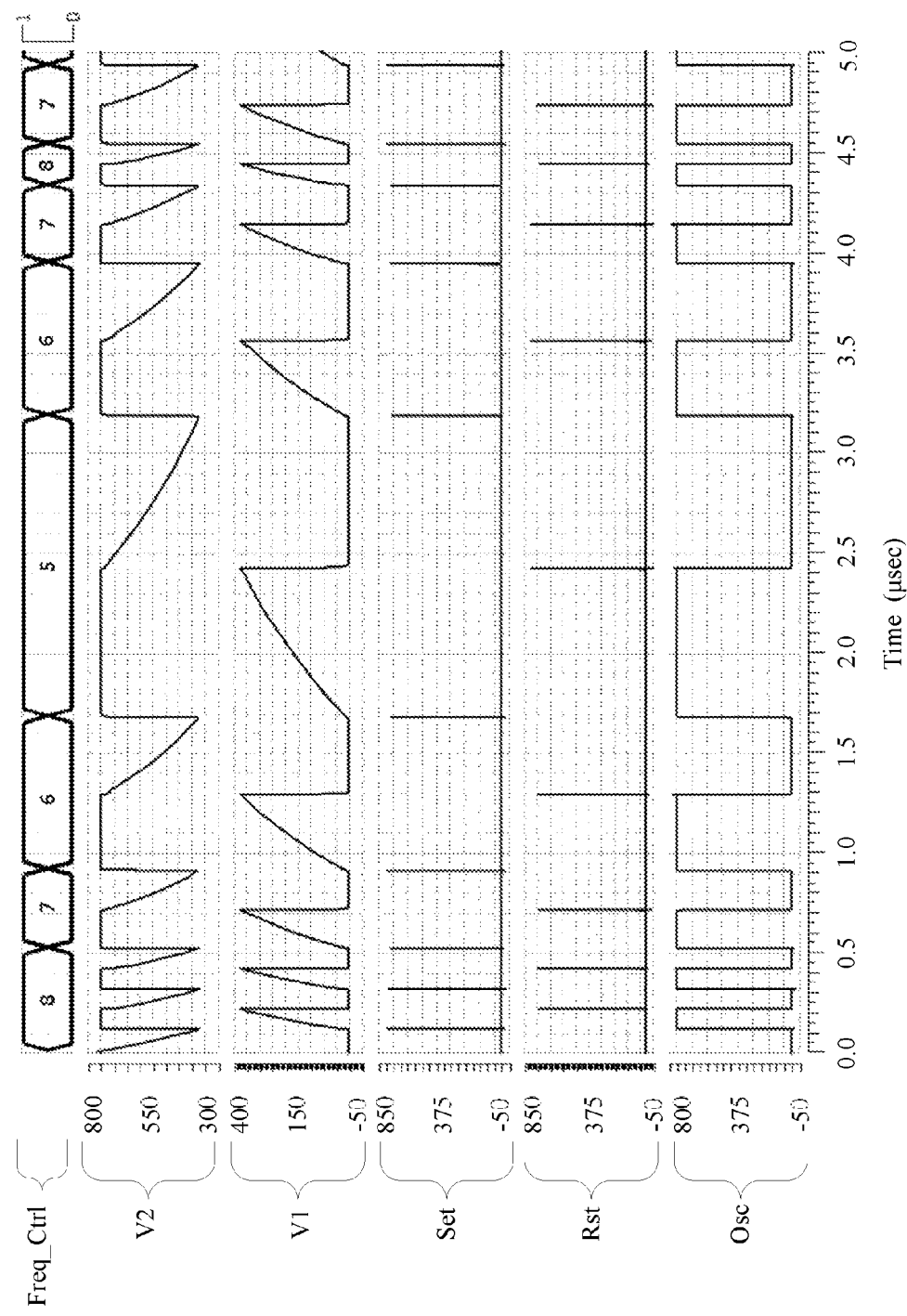
FIG. 5 is a graph showing voltages generated at various nodes of an example oscillation circuit during operation, in accordance with one or more embodiments of the present disclosure.

FIG. 5 is a graph showing voltages generated at various nodes of an example oscillation circuit during operation for various Freq_Ctrl values. As an illustrative example, operation for a Freq_Ctrl value of 5 is illustrated from approximately 1.7 μsec to 3.2 μsec.

At approximately 1.7 μsec, the Set signal is asserted and the oscillating signal is set to a high value (e.g., logic 1). In response, switching circuit begins charging capacitor C1 and discharges capacitor C2. As capacitor C1 is charged, the voltage at node V1 increases. At approximately 2.4 μsec, the voltage at node V1 (i.e., charge on capacitor C1) reaches a first threshold voltage. In response to V1 reaching the first threshold voltage, the comparison circuit asserts the Rst signal and the oscillating signal is set to a low value (e.g., logic 0).

In response to the oscillating signal being set low, the switching circuit begins charging capacitor C2 and discharges capacitor C1. Voltage at node V2 is equal to Vdd reduced by the voltage drop across the capacitor. As capacitor C2 is charged, voltage at node V2 decreases. At approximately 3.2 μsec, the voltage at node V2 falls below a second threshold voltage. In this example, the first and second threshold voltages are the same (e.g., 350 mV). However, in some embodiments, the first and second threshold voltages may differ. In response to voltage at V2 falling below the second threshold voltage, the comparison circuit asserts the Set signal and the oscillating signal is set back to the high value.

Figure 6:
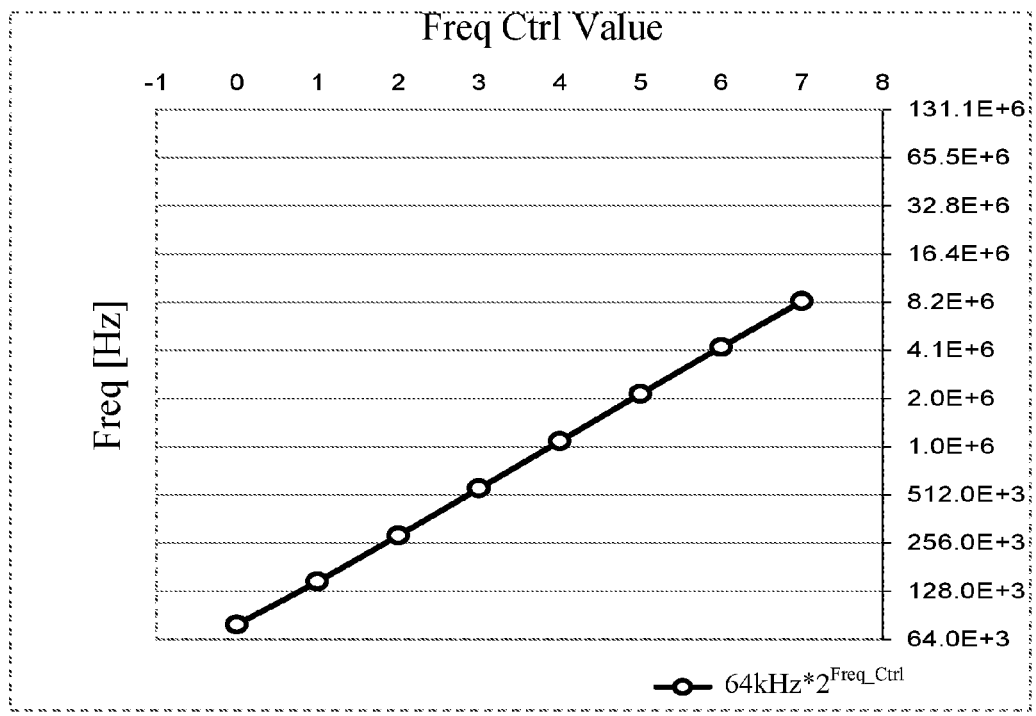
FIG. 6 is a graph showing a frequency exhibited by an example oscillation circuit configured according to one or more embodiments of the present disclosure.

FIG. 6 is a graph showing operation of an oscillation circuit configured according to one or more embodiments of the present disclosure. In this example, the oscillation frequency is adjusted as an exponential function of an input control signal Freq_Ctrl. More specifically, in this example, the oscillation frequency is set to a base frequency (64 kHz) scaled by an exponential value equal to $2^{freq\_ctrl}$. As a result of the scaling, oscillation frequency is doubled for each increment of the value of Freq_Ctrl. In different embodiments, a frequency control circuit (e.g., 120 or 270) may be adapted to adjust oscillation frequency according to other functions of the input Freq_Ctrl value. For instance, an oscillation frequency may be tripled for each increment of the Freq_Ctrl value by setting the oscillation frequency to be equal to a base frequency scaled by $3^{freq\_ctrl}$.

In some embodiments, a function used by the frequency control circuit to set oscillation frequency may be adjusted by a user. For example, frequency control circuit may be configured to set oscillation frequency according to the function oscillation frequency=freq_base(scale_val^ctrl_value)

where freq_base and scale_val values may be configured by a user. For instance, freq_base and scale_val values may be specified by control signals input to the frequency control circuit or may be stored in a non-volatile memory of the frequency control circuit.

Figure 7:
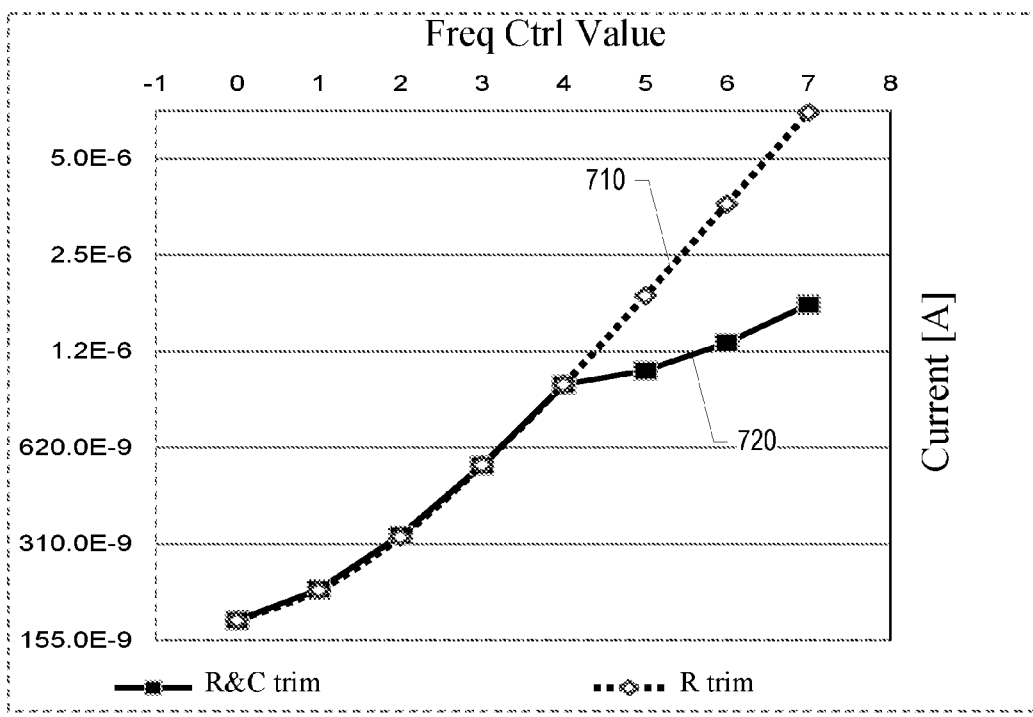
FIG. 7 is a graph showing power consumption exhibited by an example oscillation circuit configured according to one or more embodiments of the present disclosure.

FIG. 7 shows a graph of current consumption of an example oscillator circuit during operation. Plot 710 shows current consumption exhibited by the oscillator circuit when oscillation frequency is set solely via adjustment of resistance of a resistive path (e.g., 226) used to charge capacitors (e.g., 240) of the oscillator circuit. In some embodiments, a frequency control circuit (e.g., 120 or 270) may reduce power consumption by setting oscillation frequency via adjustment of both resistance of the resistive path (e.g., 226) and capacitance of the capacitors (e.g., 240). Plot 720 shows current consumption exhibited by the oscillator circuit when oscillation frequency is set solely via adjustment of resistance for selection code values 0-4 and adjustment of resistance and adjustment of capacitance of the capacitors (e.g., 240) for selection code values 5-7. At higher frequencies, corresponding to selection code values 5-7, adjustment of the oscillation frequency via only adjustment of resistance causes the oscillator to consume more current in comparison to when capacitance and resistance are both adjusted. In some embodiments, a frequency control circuit may use the same mechanism (resistance adjustment and/or capacitance adjustment) to set of oscillation frequency for all Freq_Ctrl values. In some other embodiments, the frequency control circuit may use different mechanisms for different ranges of the input Freq_Ctrl signal, for example as shown in plot 720.

A skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 110 and 120 of FIG. 1 depict a block/ module as described herein). Such circuits or circuitry are used together with other elements to exemplify how certain embodiments may be carried out in the form of structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 1, 2, 3, and 4. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described with reference to FIG. 3 is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus, comprising:
   an oscillator circuit having one or more capacitors and configured and arranged to generate an oscillating signal via repeated charging and discharging of the one or more capacitors; and
   a control circuit connected to the oscillator circuit and configured and arranged to set an oscillation frequency of the oscillator circuit as a non-linear function of an input control signal;
   wherein the control circuit is configured and arranged to set the oscillation frequency of the oscillator circuit to a frequency scaled by a value raised by an exponent value specified by the input control signal.

2. The apparatus of claim 1, wherein the oscillator circuit includes
   a first capacitor included in the one or more capacitors;
   a second capacitor included in the one or more capacitors;
   a switching circuit configured to
      operate in a first mode in response to the oscillating signal having a first value and operate in a second mode in response to the oscillating signal having a second value;
      in the first mode, charge the first capacitor via a resistive path and discharge the second capacitor; and
      in the second mode, charge the second capacitor via the resistive path and discharge the first capacitor; and
   a comparison circuit configured and arranged to set the oscillating signal to the first value based on a comparison of a voltage of the first capacitor to a first threshold voltage and set the oscillating signal to the second value based on a comparison of a voltage of the second capacitor to a second threshold voltage.

3. The apparatus of claim 2, wherein the comparison circuit includes
   an inverter circuit configured to set the oscillating signal to the first value in response to voltage at a terminal of the first capacitor falling below a threshold voltage; and
   a buffer circuit configured to set the oscillating signal to the second value in response to voltage at a terminal of the second capacitor exceeding the threshold voltage.

4. The apparatus of claim 2, wherein
   the oscillator circuit further includes a latch circuit; and
   the comparison circuit is configured and arranged to set the oscillating signal to the first value by providing a set control signal to the latch circuit and set the oscillating signal to the second value by providing a reset control signal to the latch circuit.

5. The apparatus of claim 2, wherein the switching circuit is configured and arranged to
   charge the first capacitor by providing a current in a first direction through the resistive path from a first power supply node to the first capacitor; and
   charge the second capacitor by providing a current in a second direction through the resistive path from the second capacitor to a second power supply node.

6. The apparatus of claim 1, wherein the control circuit is configured and arranged to adjust the oscillation frequency by adjusting a resistance of a resistive path of the oscillator circuit used for charging the one or more capacitors and adjusting a capacitance of the one or more capacitors.

7. The apparatus of claim 6, wherein
   the input control signal specifies a numerical value; and
   the control circuit includes
      a first circuit configured and arranged to determine a target frequency as a function having the numerical value as an exponent; and
      a second circuit configured and arranged to
         in a first clock cycle, determine a capacitance value and resistance value for the target frequency; and
         in a second clock cycle following the first clock cycle, set the oscillation frequency of the oscillator circuit to the target frequency by setting the resistance of the current path to the determined resistance value and setting the capacitance of the one or more capacitors to the determined capacitance value.

8. The apparatus of claim 7, wherein the second circuit includes a look up table storing respective pairs of resistance and capacitance values for each of a plurality of target frequencies.

9. The apparatus of claim 7, wherein the second circuit is configured and arranged to determine the target frequency by multiplying a first constant value by a second constant value raise to the power of the numerical value specified by the input control signal.

10. A method comprising:
using an oscillator circuit having one or more capacitors, generating an oscillating signal by repeated charging and discharging of the one or more capacitors; and
adjusting an oscillation frequency of the oscillating signal as a non-linear function of an input control signal;
wherein the adjusting of the oscillation frequency includes setting the oscillation frequency to a frequency scaled by a value raised by an exponent value specified by the input control signal.

11. The method of claim 10, wherein
the oscillator circuit includes a first capacitor and a second capacitor; and
the generating of the oscillating signal includes
in response to an oscillating signal having a first value, charging the first capacitor via a resistive path and discharge the second capacitor;
in response to an oscillating signal having a second value, charging the second capacitor via the resistive path and discharge the first capacitor;
setting the oscillating signal to the first value based on a comparison of a voltage of the first capacitor to a first threshold voltage; and
setting the oscillating signal to the second value based on a comparison of a voltage of the second capacitor to a second threshold voltage.

12. The method of claim 11, wherein
the oscillator circuit further includes a latch circuit configured to output the oscillating signal;
the setting the oscillating signal to the first value includes providing a set signal to the latch circuit;
the setting the oscillating signal to the second value includes providing a reset signal to the latch circuit.

13. The method of claim 12, wherein
the set signal is provided to the latch circuit by an inverter circuit configured to output the first value in response to an input of the inverter having a voltage less than the threshold voltage and output the second value in response to the input of the inverter having a voltage greater than the threshold voltage; and
the set signal is provided to the latch circuit by a buffer circuit configured to output the first value in response to an input of the buffer having a voltage greater than the threshold voltage and output the second value in response to the input of the buffer having a voltage less than the threshold voltage.

14. The method of claim 11, wherein
the charging of the first capacitor includes providing a current in a first direction through the resistive path from a first power supply node to the first capacitor; and
the charging of the second capacitor includes providing a current in a second direction through the resistive path from the second capacitor to a second power supply node.

15. The method of claim 10, wherein the adjusting of the oscillation frequency includes adjusting a resistance of a current path of the oscillator circuit connecting a current source to the one or more capacitors and adjusting a capacitance of the one or more capacitors.

16. The method of claim 10, wherein
the input control signal specifies a numerical value; and
the adjusting of the oscillation frequency includes
in a first clock cycle,
determining a target frequency as a function having the numerical value as an exponent, and
determining a capacitance value and a resistance value for the target frequency; and
in a second clock cycle following the first clock cycle, setting the oscillation frequency of the oscillator circuit to the target frequency by setting a resistance of a current path of the oscillator circuit to the determined resistance value and setting the capacitance of the one or more capacitors to the determined capacitance value.

17. The method of claim 16, wherein the determining of the capacitance value and the resistance value includes retrieving the capacitance value and resistance value from a look up table storing a respective pair of resistance and capacitance values for each of a plurality of target frequencies.

18. The method of claim 16, wherein the determining of the target frequency includes multiplying a first constant value by a second constant value raise to the power of the numerical value specified by the input control signal.

19. An apparatus, comprising:
an oscillator circuit having one or more capacitors and configured and arranged to generate an oscillating signal via repeated charging and discharging of the one or more capacitors; and
a control circuit connected to the oscillator circuit and configured and arranged to set an oscillation frequency of the oscillator circuit as a non-linear function of an input control signal;
wherein the control circuit is configured and arranged to adjust the oscillation frequency by adjusting a resistance of a resistive path of the oscillator circuit used for charging the one or more capacitors and adjusting a capacitance of the one or more capacitors; and
wherein the input control signal specifies a numerical value, and the control circuit includes,
a first circuit configured and arranged to determine a target frequency as a function having the numerical value as an exponent; and
a second circuit configured and arranged to
in a first clock cycle, determine a capacitance value and resistance value for the target frequency; and
in a second clock cycle following the first clock cycle, set the oscillation frequency of the oscillator circuit to the target frequency by setting the resistance of the current path to the determined resistance value and setting the capacitance of the one or more capacitors to the determined capacitance value.

\* \* \* \* \*